(12) United States Patent
Zhou et al.

(10) Patent No.: US 11,172,598 B1
(45) Date of Patent: Nov. 9, 2021

(54) CABLE AND CABLE PROCESSING METHOD

(71) Applicant: Lanto Electronic Limited, Kunshan (CN)

(72) Inventors: Yi Zhou, Kunshan (CN); Haifeng Yuan, Kunshan (CN); Xiansheng Zhang, Kunshan (CN)

(73) Assignee: LANTO ELECTRONIC LIMITED, Kunshan (CN)

( * ) Notice: Subject to any disclaimer, the term of this patent is extended or adjusted under 35 U.S.C. 154(b) by 0 days.

(21) Appl. No.: 17/140,845

(22) Filed: Jan. 4, 2021

(30) Foreign Application Priority Data

Aug. 18, 2020 (CN) .......................... 202010832859.4

(51) Int. Cl.
| | | |
|---|---|---|
| *H05K 9/00* | (2006.01) | |
| *H01B 7/18* | (2006.01) | |
| *H01R 43/28* | (2006.01) | |

(52) U.S. Cl.
CPC .......... *H05K 9/0075* (2013.01); *H01B 7/1875* (2013.01); *H01R 43/28* (2013.01)

(58) Field of Classification Search
CPC ................ H01R 43/28; H01R 13/6592; H01R 13/65917; H01R 13/6591; H01R 13/65912; H01B 7/1875; H05K 9/0075
See application file for complete search history.

(56) References Cited

U.S. PATENT DOCUMENTS

| | | | | |
|---|---|---|---|---|
| 7,491,071 | B2* | 2/2009 | Hamai ................. | H01R 9/0527 439/882 |
| 9,306,355 | B2* | 4/2016 | Hanazaki ............. | H01R 43/048 |
| 2005/0133245 | A1* | 6/2005 | Katsuyama ........... | H01R 9/032 174/74 R |
| 2014/0326501 | A1* | 11/2014 | Lienert .................. | H01B 1/023 174/94 R |
| 2015/0195961 | A1* | 7/2015 | Yanagihara .......... | H05K 9/0098 174/350 |

(Continued)

FOREIGN PATENT DOCUMENTS

| | | |
|---|---|---|
| CN | 234334096 U | 12/2015 |
| CN | 106486797 A | 3/2017 |

(Continued)

*Primary Examiner* — Timothy J Thompson
*Assistant Examiner* — Amol H Patel
(74) *Attorney, Agent, or Firm* — Birch, Stewart, Kolasch & Birch, LLP

(57) ABSTRACT

The present disclosure discloses a cable and a cable processing method. The cable includes a wire core, a metal braid layer, a magnetic powder layer, a metal shield, an outer sheath and an elastic ring. The metal braid layer includes an inner braid portion and an everted braid portion which are mutually connected. The inner braid portion is wrapped around an outer side of the wire core, the magnetic powder layer is wrapped around an outer side of the inner braid portion, the metal shield is wrapped around an outer side of the magnetic powder layer, and the outer sheath is wrapped around an outer side of the metal shield. The elastic ring is sleeved outside the inner braid portion, the everted braid portion is wrapped around outer sides of the elastic ring and the outer sheath, and the elastic ring covers an end surface of the metal shield.

14 Claims, 3 Drawing Sheets

(56) References Cited

U.S. PATENT DOCUMENTS

| | | | | |
|---|---|---|---|---|
| 2015/0235738 A1* | 8/2015 | Nakatani | ................ | H01B 9/006 |
| | | | | 174/34 |
| 2015/0235740 A1* | 8/2015 | Sunaga | ................ | H01B 9/021 |
| | | | | 174/109 |
| 2015/0348678 A1* | 12/2015 | Montena | .............. | H01B 7/0208 |
| | | | | 174/113 R |
| 2016/0295754 A1* | 10/2016 | Huang | .................. | H01B 11/00 |
| 2016/0314875 A1* | 10/2016 | Nakatani | ................ | H01B 11/10 |
| 2017/0020037 A1* | 1/2017 | Nakatani | ................ | H01B 9/021 |
| 2017/0271860 A1* | 9/2017 | Mashio | .................... | H02G 9/06 |
| 2018/0083433 A1* | 3/2018 | Kitagawa | ............ | H05K 9/0098 |
| 2018/0090857 A1* | 3/2018 | Masuda | ............ | H01R 13/6592 |
| 2018/0277282 A1* | 9/2018 | Mizutani | ............. | H01B 7/1875 |
| 2019/0318850 A1* | 10/2019 | Ogino | .................. | H02G 1/1248 |
| 2019/0356101 A1* | 11/2019 | Masuda | ................ | H01R 4/183 |
| 2020/0014129 A1* | 1/2020 | Hamada | ............... | H01R 4/2495 |
| 2021/0143562 A1* | 5/2021 | Fleischer | ............ | H01R 9/0524 |

FOREIGN PATENT DOCUMENTS

| | | |
|---|---|---|
| CN | 206097979 U | 4/2017 |
| CN | 106711634 A | 5/2017 |
| CN | 207458632 U | 6/2018 |

* cited by examiner

CABLE AND CABLE PROCESSING METHOD

CROSS-REFERENCE TO RELATED APPLICATION

This application claims priority to Chinese Patent Application No. 202010832859.4 filed Aug. 18, 2020, the disclosure of which is incorporated herein by reference in its entirety.

TECHNICAL FIELD

The present disclosure relates to the technical field of cables, and in particular, to a cable and a cable processing method.

BACKGROUND

A cable is typically a rope-like cable twisted from several or several sets of conductive wires (at least two per set), each set of conductive wires is insulated from each other and generally twisted around one center, and the entire outer side of the each set of conductive wires is wrapped with a highly insulated covering layer. The cable can be energized inside and is insulated outside. An existing cable is usually provided with a magnetic powder layer inside an outer insulating sheath to increase the anti-electromagnetic interference capability of the cable. However, as requirements for the anti-electromagnetic interference capability of the cable become higher and higher, the design of merely the magnetic powder layer cannot satisfy the requirements.

SUMMARY

The present disclosure provides a cable and a cable processing method, which can avoid a short circuit between metal layers of the cable while increasing the anti-electromagnetic interference capability To achieve the object, the present disclosure adopts solutions described below.

A cable includes a wire core, a metal braid layer, a magnetic powder layer, a metal shield, an outer sheath and an elastic ring, where the metal braid layer includes an inner braid portion and an everted braid portion which are mutually connected, and the inner braid portion is wrapped around an outer side of the wire core; the magnetic powder layer is wrapped around an outer side of the inner braid portion; the metal shield is wrapped around an outer side of the magnetic powder layer; the outer sheath is wrapped around an outer side of the metal shield; and the elastic ring is sleeved outside the inner braid portion, the everted braid portion is wrapped around outer sides of the elastic ring and the outer sheath, and the elastic ring covers an end surface of the metal shield to insulate the everted braid portion from the metal shield.

In an embodiment, a working end of the outer sheath, a working end of the metal shield and a working end of the magnetic powder layer are flush, the metal braid layer and the wire core extend out of the working end of the magnetic powder layer, and the elastic ring is sleeved on the outer side of the inner braid portion and covers an end surface of the working end of the metal shield.

In an embodiment, a working end of the outer sheath and a working end of the metal shield are flush, the magnetic powder layer extends out of the working end of the metal shield, the metal braid layer and the wire core extend out of a working end of the magnetic powder layer, and the elastic ring is sleeved on the outer side of the magnetic powder layer and covers an end surface of the working end of the metal shield.

In an embodiment, the metal shield extends out of a working end of the outer sheath, the magnetic powder layer extends out of a working end of the metal shield, the metal braid layer and the wire core extend out of a working end of the magnetic powder layer, and the elastic ring is sleeved on outer sides of the metal shield and the magnetic powder layer and covers an end surface of the working end of the metal shield and an outer side wall of the metal shield.

In an embodiment, in a case where the elastic ring insulates the everted braid portion from the metal shield, an inner diameter of the elastic ring is not larger than an inner diameter of the metal shield, and an outer diameter of the elastic ring is not smaller than an outer diameter of the metal shield.

In an embodiment, the elastic ring is made of rubber.

In an embodiment, a length of an outer diameter of the elastic ring is R1, a length of an inner diameter of the elastic ring is R2, and a ratio of R1 to R2 is 2:1. A cable processing method for preparing the above-mentioned cable includes steps described below. In step one, a part of an outer sheath, a part of a metal shield and a part of a magnetic powder layer are removed to expose a metal braid layer and a wire core. In step two, the elastic ring is moved to an end surface of the metal shield to cover the end surface of the metal shield. In step three, the exposed metal braid layer is everted to form an everted braid portion, where the everted braid portion is wrapped around the elastic ring and the outer sheath so that the elastic ring insulates the everted braid portion from the metal shield.

The present disclosure has beneficial effects described below.

The metal shield is provided between the magnetic powder layer and the outer sheath so that the anti-electromagnetic interference capability of the cable is increased. On this basis, the insulating elastic ring is provided to insulate the everted braid portion of the metal braid layer from the metal shield, so that the occurrence of a short circuit between the metal braid layer and the metal shield is avoided and the cable is safer and more reliable in use.

Figure 1:
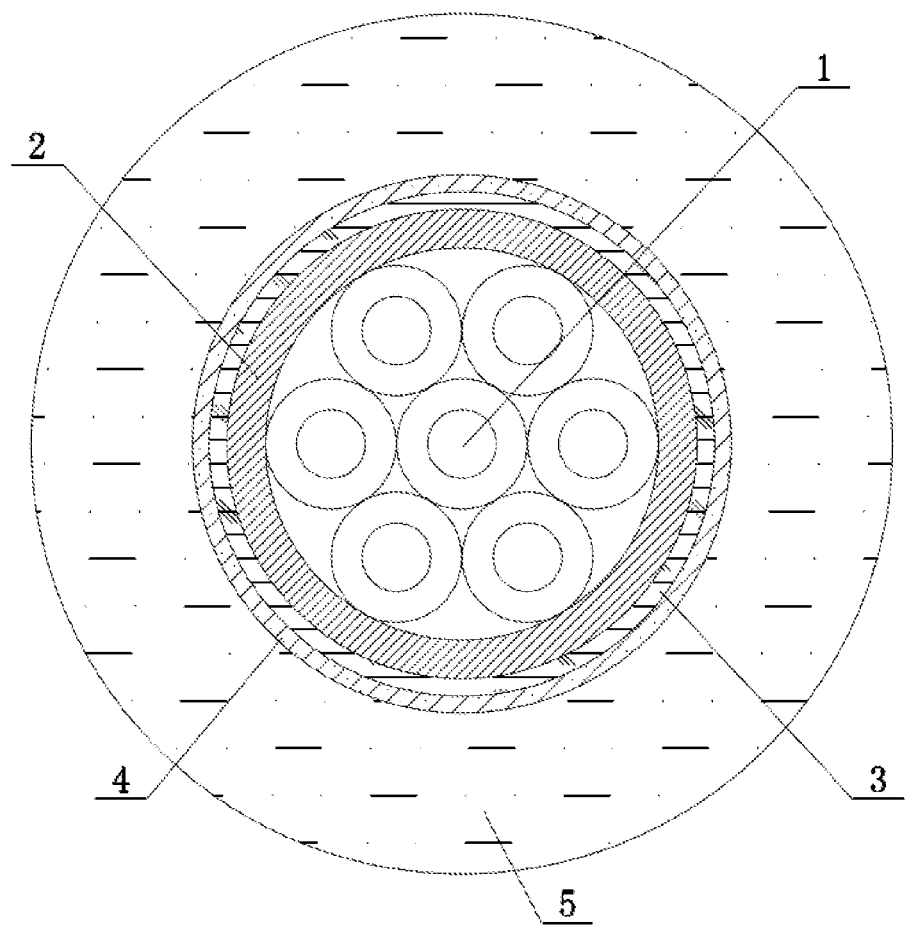
FIG. 1 is a schematic view of an end surface of a working end of a cable according to an embodiment of the present disclosure.
Figure 2:
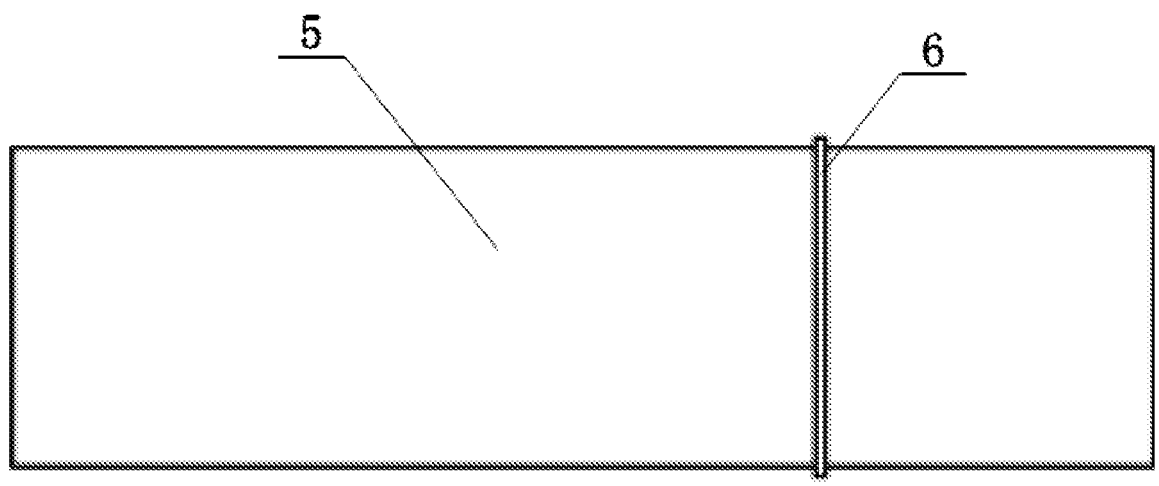
FIG. 2 is a schematic structural view of elastically expanding and sleeving an elastic ring on an outer sheath according to an embodiment of the present disclosure.
Figure 3:
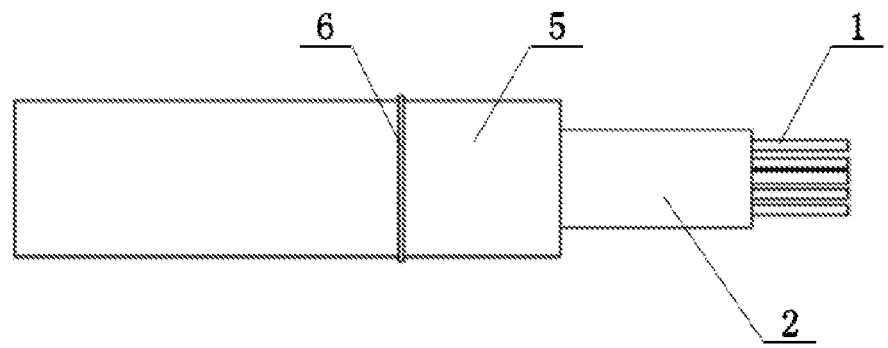
FIG. 3 is a schematic structural view of the cable of FIG. 2 with a part of an outer sheath, a part of a metal shield and a part of a magnetic powder layer removed.
Figure 4:
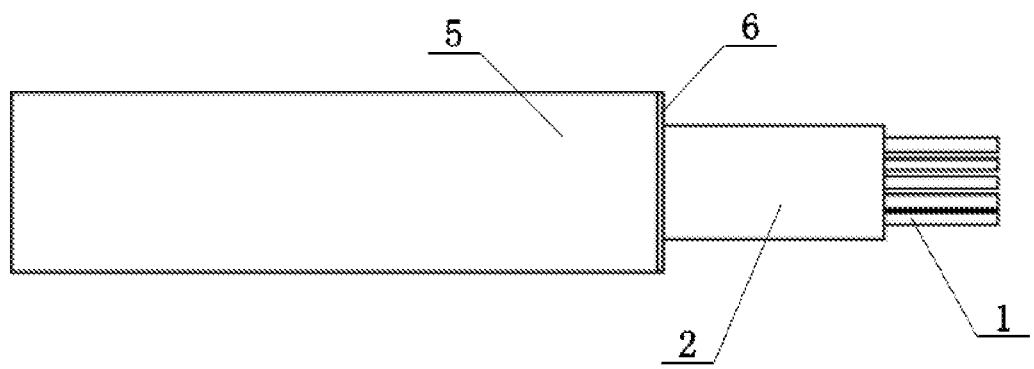
FIG. 4 is a schematic structural view of the cable of FIG. 3 with an elastic ring moved to an exposed metal braid layer so that the elastic ring abuts an end surface of the metal shield.
Figure 5:
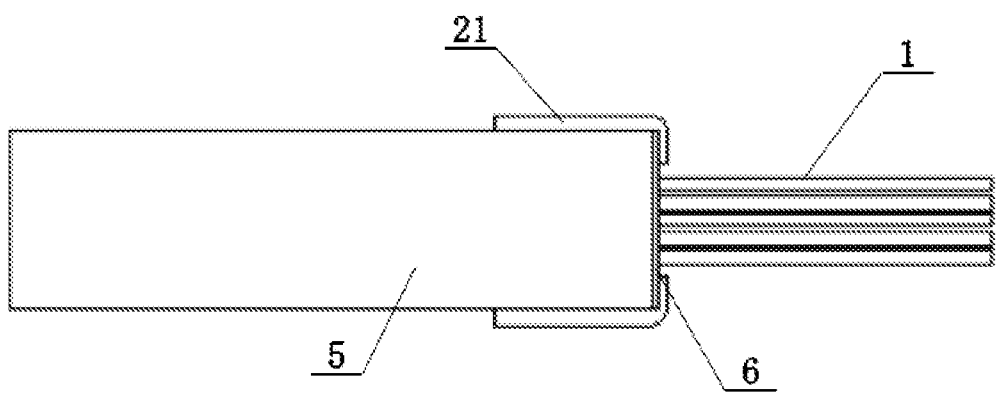
FIG. 5 is schematic structural view of the cable of FIG. 4 with the exposed metal braid layer everted to wrap an elastic ring and an outer sheath in an opposite direction.

REFERENCE LIST 1 wire core
2 metal braid layer 21 everted braid portion
3 magnetic powder layer
4 metal shield
5 outer sheath
6 elastic ring

DETAILED DESCRIPTION

Embodiments of the present disclosure will be described below in detail. Examples of the embodiments are illustrated in the drawings, where the same or similar reference numerals indicate the same or similar elements or components having the same or similar functions. The embodiments described below with reference to the drawings are merely exemplary, are intended to explain the present disclosure, and are not to be construed as limiting the present disclosure.

In the description of the present disclosure, unless otherwise expressly specified and limited, the term "connected to each other", "connected" or "secured" is to be construed in a broad sense, for example, as securely connected or detachably connected; mechanically connected or electrically connected; directly connected to each other or indirectly connected to each other via an intermediary; or internally connected between two elements or interactional relations between two elements. For those of ordinary skill in the art, specific meanings of the preceding terms in the present disclosure may be understood based on specific situations.

The solutions of the present disclosure will be further described below through embodiments in conjunction with the drawings.

As shown in FIGS. 1 to 6, the present disclosure provides a cable. The cable includes a wire core 1, a metal braid layer 2, a magnetic powder layer 3, a metal shield 4, an outer sheath 5 and an elastic ring 6. The metal braid layer 2 includes an inner braid portion and an everted braid portion 21 which are mutually connected. The inner braid portion is wrapped around an outer side of the wire core 1. The magnetic powder layer 3 is wrapped around an outer side of the inner braid portion. The metal shield 4 is wrapped around an outer side of the magnetic powder layer 3. The outer sheath 5 is wrapped around an outer side of the metal shield 4. The elastic ring 6 is sleeved outside the inner braid portion. The everted braid portion 21 is wrapped around outer sides of the elastic ring 6 and the outer sheath 5. The elastic ring 6 covers an end surface of the metal shield 4 to insulate the everted braid portion 21 from the metal shield 4.

In the present disclosure, the metal shield 4 is provided between the magnetic powder layer 3 and the outer sheath 5 so that the anti-electromagnetic interference capability of the cable is increased. On this basis, the elastic ring 6 is provided to insulate the everted braid portion 21 of the metal braid layer 2 from the metal shield 4, so that the occurrence of a short circuit between the metal braid layer 2 and the metal shield 4 is avoided and the cable is safer and more reliable in use.

In one embodiment, a working end of the outer sheath 5, a working end of the metal shield 4 and a working end of the magnetic powder layer 3 are flush. The metal braid layer 2 and the wire core 1 extend out of the working end of the magnetic powder layer 3, and the elastic ring 6 is sleeved on the outer side of the inner braid portion and covers an end surface of the working end of the metal shield 4. The above configuration enables easy processing and low accuracy requirement for the dimension of the elastic ring 6.

In another embodiment, a working end of the outer sheath 5 and a working end of the metal shield 4 are flush, the magnetic powder layer 3 extends out of the working end of the metal shield 4, the metal braid layer 2 and the wire core 1 extend out of a working end of the magnetic powder layer 3, and the elastic ring 6 is sleeved on the outer side of the magnetic powder layer 3 and covers an end surface of the working end of the metal shield 4. In the above-mentioned configuration, the elastic ring 6 is sleeved on the basis of the magnetic powder layer 3, thus effectively reducing the material volume of the elastic ring 6 and cutting the cost.

In a third embodiment, the metal shield 4 extends out of a working end of the outer sheath 5, the magnetic powder layer 3 extends out of a working end of the metal shield 4, the metal braid layer 2 and the wire core 1 extend out of a working end of the magnetic powder layer 3, and the elastic ring 6 is sleeved on outer sides of the metal shield 4 and the magnetic powder layer 3 and covers an end surface of the working end of the metal shield 4 and an outer side wall of the metal shield 4. In the above-mentioned configuration, the elastic ring 6 has an L-shaped section, and insulates and protects the metal shield 4 from the end surface and the outer side wall of the metal shield 4, so that moving and shifting of the elastic ring 6 is avoided and a better protection effect is achieved.

In a fourth embodiment, a working end of the outer sheath 5 and a working end of the magnetic powder layer 3 are flush and are disposed protruding relative to a working end of the metal shield 4 to form an annular groove around the working end of the metal shield 4. The metal braid layer 2 and the wire core 1 extend out of the working end of the magnetic powder layer 3. The elastic ring 6 is sleeved on the outer side of the magnetic powder layer 3 and engaged into the annular groove to cover an end surface of the working end of the metal shield 4. The above configuration enables more accurate positioning installation of the elastic ring 6 so that the elastic ring 6 is not easy to move and shift and a better protection effect is achieved.

Specifically, in a case where the elastic ring 6 insulates the everted braid portion 21 from the metal shield 4, an inner diameter of the elastic ring 6 is not larger than an inner diameter of the metal shield 4, and an outer diameter of the elastic ring 6 is not smaller than an outer diameter of the metal shield 4. The above configuration ensures that the elastic ring 6 completely covers the end surface of the metal shield 4 in the radial direction.

More specifically, the elastic ring 6 is made of rubber, and thus has the ability of elastic deformation besides insulation.

Figure 6:
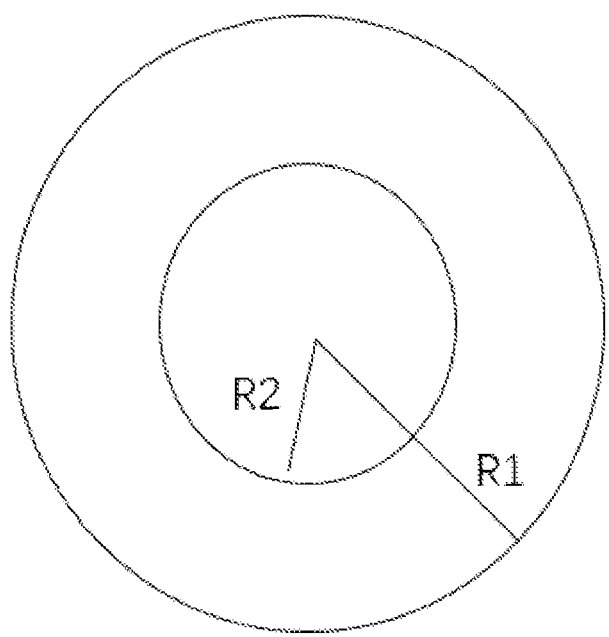
FIG. 6 is a sectional view of an elastic ring according to an embodiment of the present disclosure.

In this embodiment, as shown in FIG. 6, the outer diameter (which here refers to a radius) of the elastic ring 6 is R1, the inner diameter (which here refers to a radius) of the elastic ring 6 is R2, and the length ratio of R1 to R2 is 2:1.

The present disclosure further provides a cable processing method for preparing the above-mentioned cable. The method includes steps described below.

In step one, a part of an outer sheath 5, a part of a metal shield 4 and a part of a magnetic powder layer 3 are removed to expose a metal braid layer 2 and a wire core 1.

In this step, in the operation of one embodiment, the lengths of the removed parts of the outer sheath 5, the metal shield 4 and the magnetic powder layer 3 are equal.

In the operation of another embodiment, the lengths of the removed parts of the outer sheath 5 and the metal shield 4 are equal, and the length of the removed part of the magnetic powder layer 3 is shorter than the length of the removed part of the metal shield 4.

In the operation of a third embodiment, the length of the removed part of the outer sheath 5 is longer than the length of the removed part of the metal shield 4, and the length of the removed part of the metal shield 4 is longer than the length of the removed part of the magnetic powder layer 3.

In the operation of a fourth embodiment, the length of the removed part of the metal shield 4 is longer than the length of the removed part of the outer sheath 5, and the length of the removed part of the metal shield 4 is longer than the length of the removed part of the magnetic powder layer 3.

In step two, an elastic ring 6 is sleeved on an outer side of the cable, and the elastic ring 6 is moved to an end surface of the metal shield 4 to cover the end surface of the metal shield 4.

In this step, the elastic ring 6 in use is made of rubber, and thus has the ability of elastic deformation besides insulation.

In a specific operation, the elastic ring 6 is first elastically expanded and sleeved on the outer sheath 5, and then moved to the exposed metal braid layer 2, so that the elastic ring 6 elastically recovers to cover the end surface of the metal shield 4.

In a case where the lengths of the removed parts of the outer sheath 5, the metal shield 4 and the magnetic powder layer 3 are equal, the elastic ring 6 is sleeved on an outer side of the metal braid layer 2 to cover the end surface of the metal shield 4.

In a case where the lengths of the removed parts of the outer sheath 5 and the metal shield 4 are equal and the length of the removed part of the magnetic powder layer 3 is shorter than the length of the removed part of the metal shield 4, the elastic ring 6 is sleeved on an outer side of the magnetic powder layer 3 to cover the end surface of the metal shield 4.

In a case where the length of the removed part of the outer sheath 5 is longer than the length of the removed part of the metal shield 4 and the length of the removed part of the metal shield 4 is longer than the length of the removed part of the magnetic powder layer 3, the elastic ring 6 is L-shaped, and is sleeved on outer sides of the metal shield 4 and the magnetic powder layer 3 to cover the end surface and the outer side wall of the metal shield 4.

In a case where the length of the removed part of the metal shield 4 is longer than the length of the removed part of the outer sheath 5 and the length of the removed part of the metal shield 4 is longer than the length of the removed part of the magnetic powder layer 3, the elastic ring 6 is sleeved on the outer side of the magnetic powder layer 3 and is disposed between the outer sheath 5 and the magnetic powder layer 3 to cover the end surface of the metal shield 4.

In step three, the exposed metal braid layer 2 is everted to form an everted braid portion 21, where the everted braid portion 21 is wrapped around the elastic ring 6 and the outer sheath 5 in an opposite direction so that the elastic ring 6 insulates the everted braid portion 21 from the metal shield 4.

In this step, the exposed metal braid layer 2 is everted to form the everted braid portion 21.

Apparently, the above embodiments of the present disclosure are merely illustrative of the present disclosure and are not intended to limit the embodiments of the present disclosure. For those of ordinary skill in the art, alterations or modifications in other different forms can be made based on the above description. Implementations of the present disclosure cannot be and do not need to be exhausted herein. Any modification, equivalent substitution and improvement within the spirit and principle of the present disclosure fall within the scope of the claims of the present disclosure.

What is claimed is:

1. A cable, comprising:
   a wire core;
   a metal braid layer, comprising an inner braid portion and an everted braid portion which are mutually connected, wherein the inner braid portion is wrapped around an outer side of the wire core;
   a magnetic powder layer, wrapped around an outer side of the inner braid portion;
   a metal shield, wrapped around an outer side of the magnetic powder layer;
   an outer sheath, wrapped around an outer side of the metal shield; and
   an elastic ring, sleeved outside the inner braid portion, wherein the everted braid portion is wrapped around outer sides of the elastic ring and the outer sheath, and the elastic ring is configured to cover an end surface of the metal shield to insulate the everted braid portion from the metal shield.

2. The cable according to claim 1, wherein a working end of the outer sheath, a working end of the metal shield and a working end of the magnetic powder layer are flush, the metal braid layer and the wire core extend out of the working end of the magnetic powder layer, and the elastic ring is sleeved on the outer side of the inner braid portion and covers an end surface of the working end of the metal shield.

3. A cable processing method for preparing the cable according to claim 2, comprising:
   removing a part of the outer sheath, a part of the metal shield and a part of the magnetic powder layer, which are at one end of the cable, to expose the metal braid layer and the wire core;
   sleeving the elastic ring on an outer side of the cable, and moving the elastic ring to the end surface of the metal shield to cover the end surface of the metal shield; and
   everting the exposed metal braid layer to form the everted braid portion, wherein the everted braid portion is wrapped around the elastic ring and the outer sheath, so that the elastic ring insulates the everted braid portion from the metal shield.

4. The cable according to claim 1, wherein a working end of the outer sheath and a working end of the metal shield are flush, the magnetic powder layer extends out of the working end of the metal shield, the metal braid layer and the wire core extend out of a working end of the magnetic powder layer, and the elastic ring is sleeved on the outer side of the magnetic powder layer and covers an end surface of the working end of the metal shield.

5. A cable processing method for preparing the cable according to claim 4, comprising:
   removing a part of the outer sheath, a part of the metal shield and a part of the magnetic powder layer, which are at one end of the cable, to expose the metal braid layer and the wire core;
   sleeving the elastic ring on an outer side of the cable, and moving the elastic ring to the end surface of the metal shield to cover the end surface of the metal shield; and
   everting the exposed metal braid layer to form the everted braid portion, wherein the everted braid portion is wrapped around the elastic ring and the outer sheath, so that the elastic ring insulates the everted braid portion from the metal shield.

6. The cable according to claim 1, wherein the metal shield extends out of a working end of the outer sheath, the magnetic powder layer extends out of a working end of the metal shield, the metal braid layer and the wire core extends out of a working end of the magnetic powder layer, and the elastic ring is sleeved on outer sides of the metal shield and the magnetic powder layer and covers an end surface of the working end of the metal shield and an outer side wall of the metal shield.

7. A cable processing method for preparing the cable according to claim 6, comprising:

removing a part of the outer sheath, a part of the metal shield and a part of the magnetic powder layer, which are at one end of the cable, to expose the metal braid layer and the wire core;

sleeving the elastic ring on an outer side of the cable, and moving the elastic ring to the end surface of the metal shield to cover the end surface of the metal shield; and everting the exposed metal braid layer to form the everted braid portion, wherein the everted braid portion is wrapped around the elastic ring and the outer sheath, so that the elastic ring insulates the everted braid portion from the metal shield.

8. The cable according to claim 1, wherein in a case where the elastic ring insulates the everted braid portion from the metal shield, an inner diameter of the elastic ring is not larger than an inner diameter of the metal shield, and an outer diameter of the elastic ring is not smaller than an outer diameter of the metal shield.

9. A cable processing method for preparing the cable according to claim 8, comprising:

removing a part of the outer sheath, a part of the metal shield and a part of the magnetic powder layer, which are at one end of the cable, to expose the metal braid layer and the wire core;

sleeving the elastic ring on an outer side of the cable, and moving the elastic ring to the end surface of the metal shield to cover the end surface of the metal shield; and everting the exposed metal braid layer to form the everted braid portion, wherein the everted braid portion is wrapped around the elastic ring and the outer sheath, so that the elastic ring insulates the everted braid portion from the metal shield.

10. The cable according to claim 1, wherein the elastic ring is made of rubber.

11. A cable processing method for preparing the cable according to claim 10, comprising:

removing a part of the outer sheath, a part of the metal shield and a part of the magnetic powder layer, which are at one end of the cable, to expose the metal braid layer and the wire core;

sleeving the elastic ring on an outer side of the cable, and moving the elastic ring to the end surface of the metal shield to cover the end surface of the metal shield; and everting the exposed metal braid layer to form the everted braid portion, wherein the everted braid portion is wrapped around the elastic ring and the outer sheath, so that the elastic ring insulates the everted braid portion from the metal shield.

12. The cable according to claim 1, wherein a length of an outer diameter of the elastic ring is R1, a length of an inner diameter of the elastic ring is R2, and a ratio of R1 to R2 is 2:1.

13. A cable processing method for preparing the cable according to claim 12, comprising:

removing a part of the outer sheath, a part of the metal shield and a part of the magnetic powder layer, which are at one end of the cable, to expose the metal braid layer and the wire core;

sleeving the elastic ring on an outer side of the cable, and moving the elastic ring to the end surface of the metal shield to cover the end surface of the metal shield; and everting the exposed metal braid layer to form the everted braid portion, wherein the everted braid portion is wrapped around the elastic ring and the outer sheath, so that the elastic ring insulates the everted braid portion from the metal shield.

14. A cable processing method for preparing the cable according to claim 1, comprising:

removing a part of the outer sheath, a part of the metal shield and a part of the magnetic powder layer, which are at one end of the cable, to expose the metal braid layer and the wire core;

sleeving the elastic ring on an outer side of the cable, and moving the elastic ring to the end surface of the metal shield to cover the end surface of the metal shield; and everting the exposed metal braid layer to form the everted braid portion, wherein the everted braid portion is wrapped around the elastic ring and the outer sheath, so that the elastic ring insulates the everted braid portion from the metal shield.

\* \* \* \* \*